(12) United States Patent
Yu

(10) Patent No.: US 6,372,561 B1
(45) Date of Patent: Apr. 16, 2002

(54) FABRICATION OF FULLY DEPLETED FIELD EFFECT TRANSISTOR FORMED IN SOI TECHNOLOGY WITH A SINGLE IMPLANTATION STEP

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/872,718

(22) Filed: Jun. 1, 2001

(51) Int. Cl.[7] .......................... H01L 21/00; H01L 21/84
(52) U.S. Cl. ................. 438/162; 438/165; 438/151; 438/152; 438/407
(58) Field of Search ................. 438/162–165, 438/407, 149, 151, 154, 219; 257/347, 643, 642, 506, 792

(56) References Cited

U.S. PATENT DOCUMENTS

| | | | | |
|---|---|---|---|---|
| 5,914,510 A | * | 6/1999 | Hieda | 257/301 |
| 5,965,918 A | * | 10/1999 | Ono | 257/347 |
| 6,087,698 A | * | 7/2000 | Saito et al. | 257/347 |
| 6,211,041 B1 | * | 4/2001 | Ogura | 257/347 |
| 6,313,507 B1 | * | 11/2001 | Lee | 257/347 |
| 6,326,667 B1 | * | 12/2001 | Sugiyama et al. | 257/18 |
| 2001/0004121 A1 | * | 6/2001 | Sakama et al. | 257/347 |

* cited by examiner

*Primary Examiner*—Michael S. Lebentritt
(74) *Attorney, Agent, or Firm*—Monica H. Choi

(57) ABSTRACT

For fabricating a field effect transistor in SOI (semiconductor on insulator) technology, an opening is etched through a first surface of a first semiconductor substrate, and a dielectric material is deposited to fill the opening. The dielectric material and the first surface of the first semiconductor substrate are polished down to form a dielectric island comprised of the dielectric material surrounded by the first surface of the first semiconductor substrate that is exposed. The semiconductor material of the first semiconductor substrate remains on the dielectric island toward a second surface of the first semiconductor substrate. A layer of dielectric material is deposited on a second semiconductor substrate. The first surface of the first semiconductor substrate is placed on the layer of dielectric material of the second semiconductor substrate such that the dielectric island and the first surface of the first semiconductor substrate are bonded to the layer of dielectric material. A drain extension region and a source extension region are formed by the drain and source dopant being implanted in the thinner semiconductor material disposed on the dielectric island. In addition, a drain contact region and a source contact region are formed by the drain and source dopant being implanted in the thicker semiconductor material of the first semiconductor substrate disposed to sides of the dielectric island.

14 Claims, 5 Drawing Sheets

FABRICATION OF FULLY DEPLETED FIELD EFFECT TRANSISTOR FORMED IN SOI TECHNOLOGY WITH A SINGLE IMPLANTATION STEP

TECHNICAL FIELD

The present invention relates generally to fabrication of field effect transistors having scaled-down dimensions, and more particularly, to fabrication of a fully depleted field effect transistor with a thin body formed on a dielectric island in SOI (semiconductor on insulator) technology such that a single implantation step is used to form the drain and source extension regions and the drain and source contact regions.

BACKGROUND OF THE INVENTION

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes spacers 122 disposed on the sidewalls of the gate electrode 118 and the gate dielectric 116. When the spacers 122 are comprised of silicon nitride ($Si_3N_4$), then a spacer liner oxide 124 is deposited as a buffer layer between the spacers 122 and the sidewalls of the gate electrode 118 and the gate dielectric 116.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 100 are scaled down further, the junction capacitances formed by the drain and source extension junctions 104 and 106 and by the drain and source contact junctions 108 and 112 may limit the speed performance of the MOSFET 100. Thus, referring to FIG. 2, a MOSFET 150 is formed with SOI (semiconductor on insulator) technology. In that case, a layer of buried insulating material 152 is formed on the semiconductor substrate 102, and a layer of semiconductor material 154 is formed on the layer of buried insulating material 152. Elements such as the gate dielectric 116, the gate electrode 118, the spacers 122, and the spacer liner oxide 124 having the same reference number in FIGS. 1 and 2 refer to elements having similar structure and function.

A drain extension junction 156 and a source extension junction 158 of the MOSFET 150 are formed in the layer of semiconductor material 154. The drain extension junction 156 and the source extension junction 158 are shallow junctions to minimize short-channel effects in the MOSFET 150 having submicron or nanometer dimensions, as known to one of ordinary skill in the art of integrated circuit fabrication. A channel region 160 of the MOSFET 150 is the portion of the layer of semiconductor material 154 between the drain and source extension junctions 156 and 158.

In addition, a drain contact region 162 is formed by the drain extension junction 156, and a source contact region 164 is formed by the source extension junction 158. A drain silicide 166 is formed with the drain contact region 162 to provide contact to the drain of the MOSFET 150, and a source silicide 168 is formed with the source contact region 164 to provide contact to the source of the MOSFET 150. Processes for formation of such structures of the MOSFET 150 are known to one of ordinary skill in the art of integrated circuit fabrication.

The drain contact region 162 and the source contact region 164 are formed to extend down to contact the layer of buried insulating material 152. Thus, because the drain contact region 162 and the source contact region 164 of the MOSFET 160 do not form a junction with the semiconductor substrate 102, junction capacitance is minimized for the MOSFET 150 to enhance the speed performance of the MOSFET 150 formed with SOI (semiconductor on insulator) technology.

Furthermore, during operation of the MOSFET 150, the channel region 160 may be fully depleted when the layer of semiconductor material 154 is relatively thin having a thickness in a range of from about 50 angstroms to about 200 angstroms. When the channel region 160 of the MOSFET 150 is fully depleted, undesired short channel effects of the MOSFET 150 are further minimized, as known to one of ordinary skill in the art of integrated circuit fabrication. However, such a thin layer of semiconductor material 154 is undesirable because a low volume of the drain silicide 166 and the source silicide 168 results in high parasitic series resistance at the drain and the source of the MOSFET 150. Such high parasitic series resistance at the drain and the source of the MOSFET 150 degrades the speed performance of the MOSFET 150.

Thus, a mechanism is desired for forming a field effect transistor in SOI (semiconductor on insulator) technology with drain and source extension regions formed with a thin portion of semiconductor material such that the channel region of the field effect transistor is fully depleted and with drain and source contact regions formed with a thick portion of the semiconductor material to minimize series resistance at the drain and source of the field effect transistor.

SUMMARY OF THE INVENTION

Accordingly, in a general aspect of the present invention, a field effect transistor is formed in SOI (semiconductor on insulator) technology with the drain and source extension regions formed with thinner semiconductor material on a dielectric island and with drain and source contact regions formed with thicker semiconductor material disposed to the sides of the dielectric island.

In one embodiment of the present invention, for fabricating a field effect transistor in SOI (semiconductor on insulator) technology, an opening is etched through a first surface of a first semiconductor substrate, and a dielectric material is deposited to fill the opening. The dielectric material and the first surface of the first semiconductor substrate are polished down to form a dielectric island comprised of the dielectric material surrounded by the first surface of the first semiconductor substrate that is exposed. The semiconductor material of the first semiconductor substrate remains on the dielectric island toward a second surface of the first semiconductor substrate. A layer of dielectric material is deposited on a second semiconductor substrate. The first surface of the first semiconductor substrate is placed on the layer of dielectric material of the second semiconductor substrate such that the dielectric island and the first surface of the first semiconductor substrate are bonded to the layer of dielectric material.

The second surface of the first semiconductor substrate is exposed, and a gate dielectric and a gate electrode are formed over a portion of the semiconductor material disposed on the dielectric island on the second surface of the first semiconductor substrate. A drain and source dopant is implanted into the second surface of the first semiconductor substrate that is exposed. A drain extension region and a source extension region are formed by the drain and source dopant being implanted in the semiconductor material disposed on the dielectric island. In addition, a drain contact region and a source contact region are formed by the drain and source dopant being implanted in the semiconductor material of the first semiconductor substrate disposed to sides of the dielectric island.

The present invention may be practiced to particular advantage when the first and second semiconductor substrates are comprised of silicon and when the dielectric island within the first semiconductor substrate and the layer of dielectric material on the second semiconductor substrate are comprised of silicon dioxide ($SiO_2$), according to one embodiment of the present invention.

In this manner, the drain and source extension regions are formed with the thinner semiconductor material on the dielectric island to minimize short channel effects of the field effect transistor. On the other hand, the drain and source contact regions are formed with the thicker semiconductor material to the sides of the dielectric island such that thicker drain and source suicides are formed. With thicker drain and source suicides, the series resistance at the drain and source of the field effect transistor is minimized to enhance the speed performance of the field effect transistor. In addition, the field effect transistor is formed in SOI (semiconductor on insulator) technology such that junction capacitance is minimized for the field effect transistor to further enhance the speed performance of the field effect transistor.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, and 15 refer to elements having similar structure and function.

DETAILED DESCRIPTION

Figure 1:
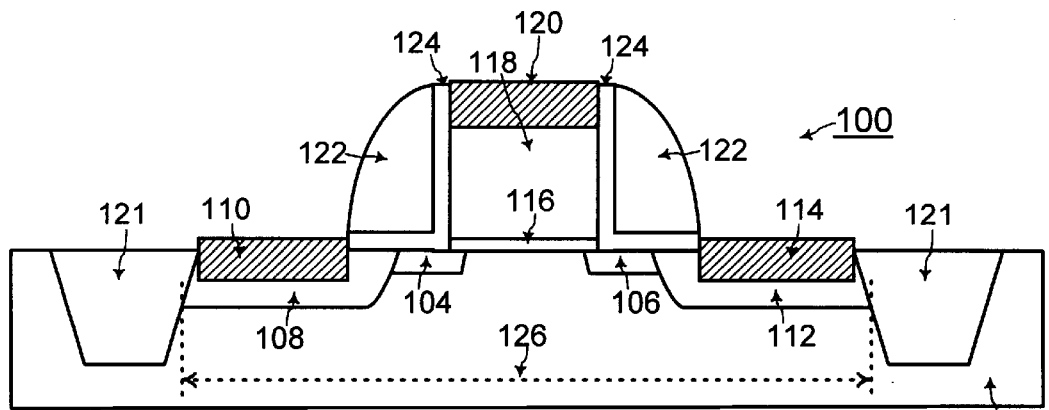
FIG. 1 shows a cross-sectional view of a conventional MOSFET (Metal Oxide Semiconductor Field Effect Transistor) fabricated within a bulk semiconductor substrate, according to the prior art.
Figure 2:
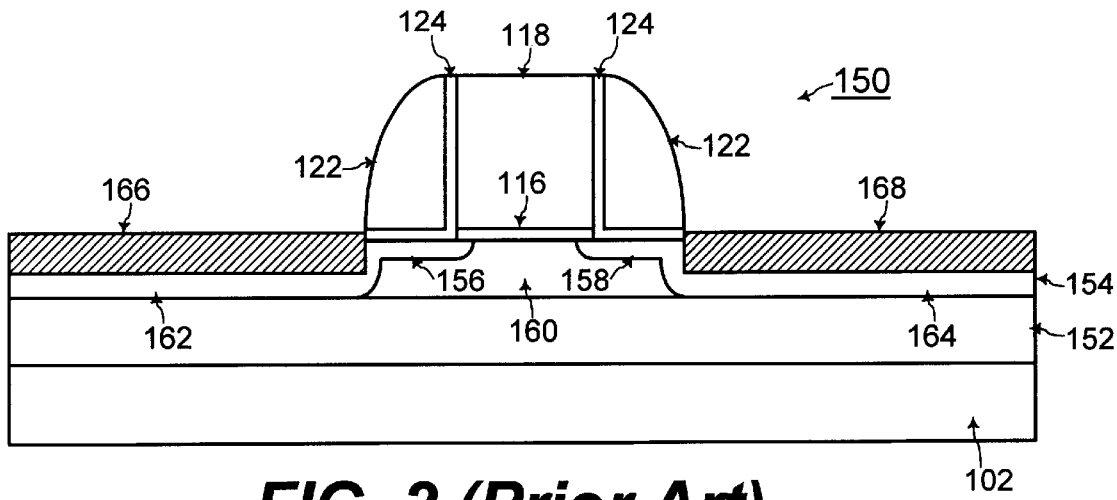
FIG. 2 shows a cross-sectional view of a MOSFET (Metal Oxide Semiconductor Field Effect Transistor) fabricated with SOI (semiconductor on insulator) technology for minimizing junction capacitance, according to the prior art.
Figure 3:
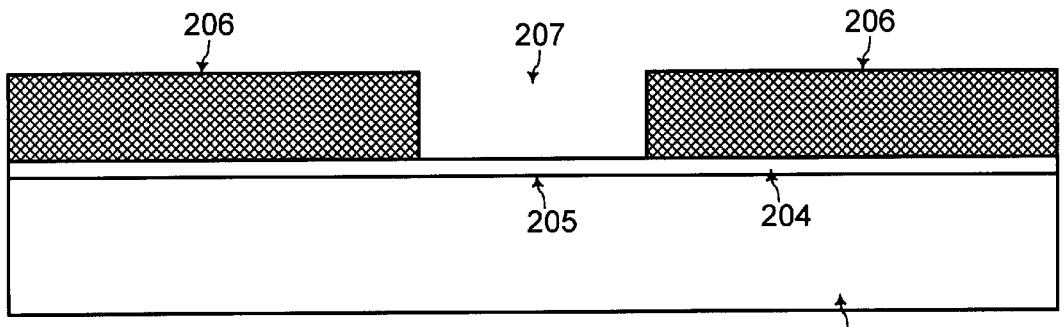
FIGS. 3, 4, 5, 6, 7, 8, 9, 10, 11, 12, 13, 14, and 15 show cross-sectional views for illustrating the steps for forming a field effect transistor in SOI (semiconductor on insulator) technology with the drain and source extension regions formed with thinner semiconductor material on a dielectric island and with drain and source contact regions formed with thicker semiconductor material to the sides of the dielectric island, according to an embodiment of the present invention.

In the cross-sectional view of FIG. 3, for fabricating a MOSFET (Metal Oxide Semiconductor Field Effect Transistor) in SOI (semiconductor on insulator) technology, a hardmask layer 204 is formed on a first face 205 of a first semiconductor substrate 202. The first semiconductor substrate 202 is comprised of silicon, and the hardmask layer 204 is comprised of silicon nitride ($Si_3N_4$), according to one embodiment of the present invention. In addition, a layer of masking material 206 is patterned to form an opening 207 in the layer of masking material 206. The layer of masking material 206 is comprised of photoresist material according to one embodiment of the present invention, and processes for patterning such material to form the opening 207 are known to one of ordinary skill in the art of integrated circuit fabrication.

Figure 4:
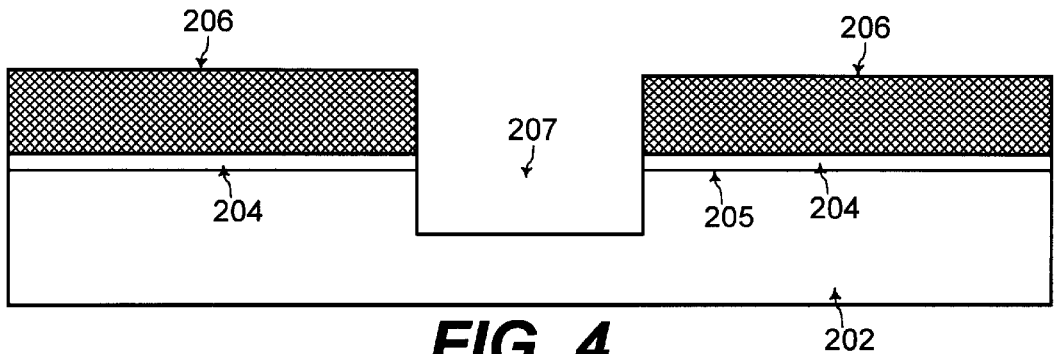

Referring to FIG. 4, the exposed portion of the hardmask layer 204 and the first semiconductor substrate 202 is etched such that the opening 207 extends down through the hardmask layer 204 and down into the first semiconductor substrate 202. Processes for etching the exposed portion of the hardmask layer 204 comprised of silicon nitride ($Si_3N_4$) for example and the first semiconductor substrate 202 comprised of silicon for example are known to one of ordinary skill in the art of integrated circuit fabrication.

Figure 5:
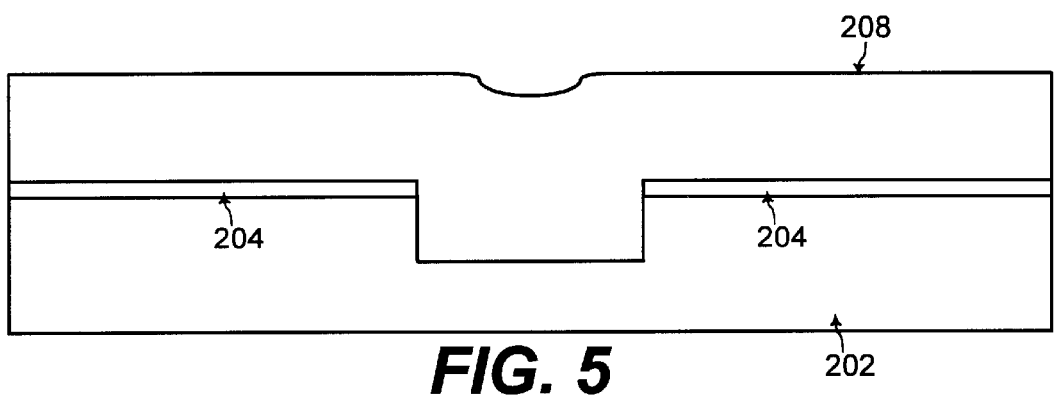

Referring to FIG. 5, the layer of masking material 206 is removed after the opening 207 is formed in the first semiconductor substrate 202. Processes for etching away the layer of masking material 206 comprised of photoresist material for example are known to one of ordinary skill in the art of integrated circuit fabrication. Further referring to FIG. 5, dielectric material 208 is deposited to fill the opening 207, and the dielectric material 208 is comprised of silicon dioxide ($SiO_2$) according to one embodiment of the present invention. Processes for depositing such dielectric material 208 to fill the opening 207 are known to one of ordinary skill in the art of integrated circuit fabrication.

Figure 6:
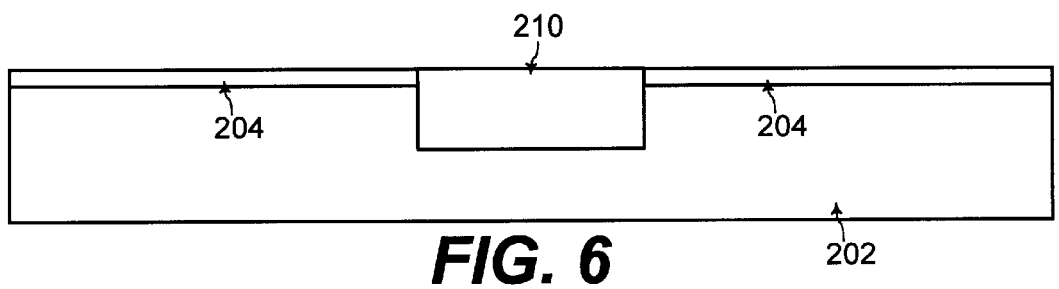

Referring to FIG. 6, the dielectric material 208 is polished down until the hardmask layer 204 is exposed when the hardmask layer 204 is used as a polish stop. Polishing processes such as CMP (chemical mechanical polishing) processes for polishing down the dielectric material 208 comprised of silicon dioxide ($SiO_2$) for example with the hardmask layer 204 being used as a polish stop are known to one of ordinary skill in the art of integrated circuit fabrication. The dielectric material 208 contained within the opening 207 forms a dielectric island 210.

Figure 7:
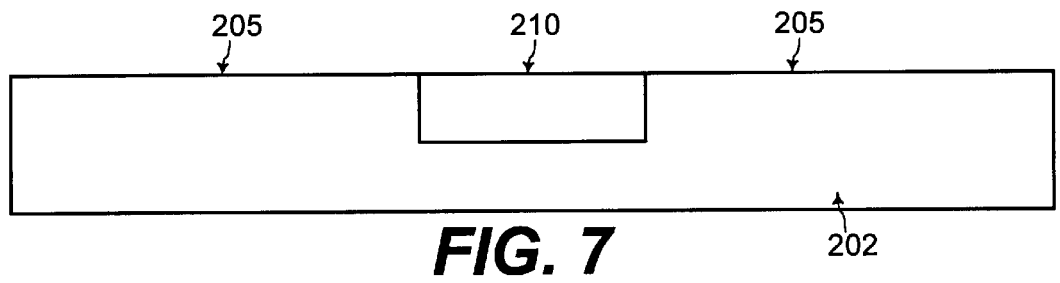

Referring to FIG. 7, the hardmask layer 204 is etched away to expose the first surface 205 of the first semiconductor substrate 202. Processes for etching away the hardmask layer 204 comprised of silicon nitride ($Si_3N_4$) for example are known to one of ordinary skill in the art of integrated circuit fabrication. Further referring to FIG. 7, the dielectric island 210 and the first surface 205 of the first semiconductor substrate 202 are further polished down such that the dielectric island 210 is level with the first surface 205 of the first semiconductor substrate 202. Polishing processes such as CMP (chemical mechanical polishing) processes for polishing down the dielectric island 210 and the first surface 205 of the first semiconductor substrate 202 are known to one of ordinary skill in the art of integrated circuit fabrication.

Figure 8:
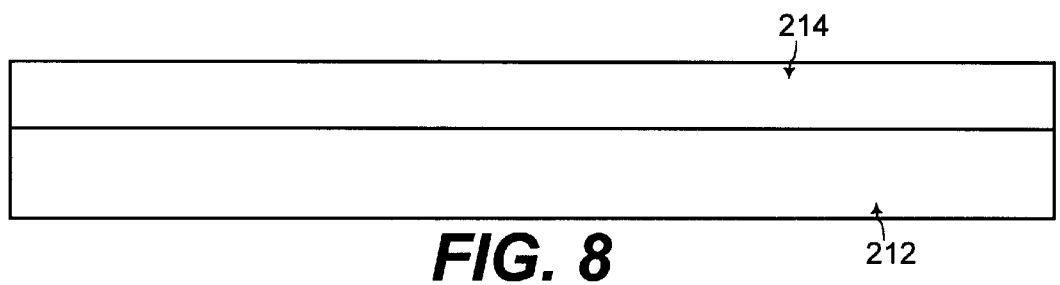

Referring to FIG. 8, a layer of dielectric material 214 is formed on a second semiconductor substrate 212. The second semiconductor substrate 212 is comprised of silicon, and the layer of dielectric material 214 is comprised of silicon dioxide ($SiO_2$) having a thickness in a range of from about 2000 angstroms to about 5000 angstroms according to one embodiment of the present invention. Processes for forming such a layer of dielectric material 214 on the second semiconductor substrate 212 are known to one of ordinary skill in the art of integrated circuit fabrication.

Figure 9:
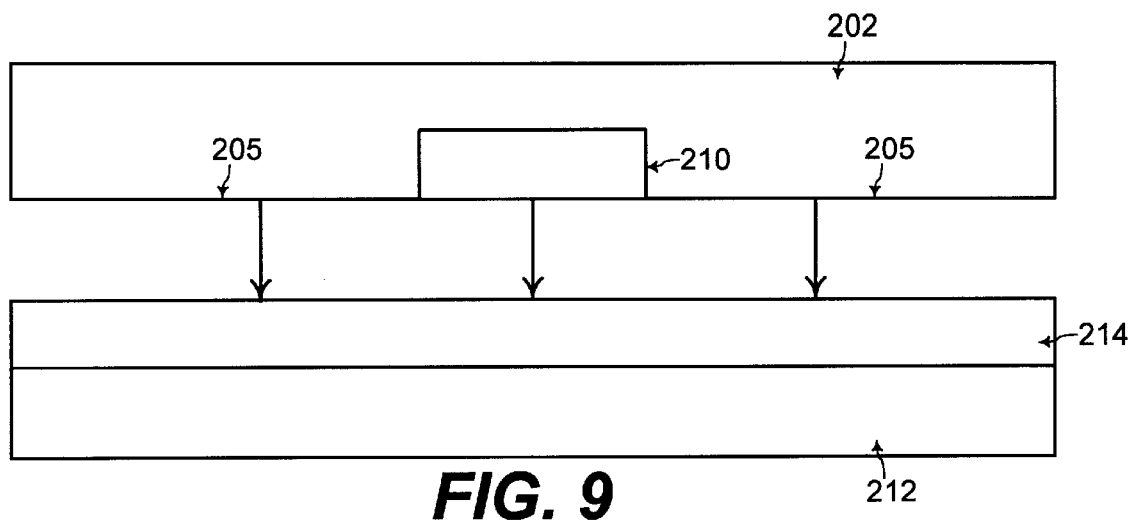
Figure 10:
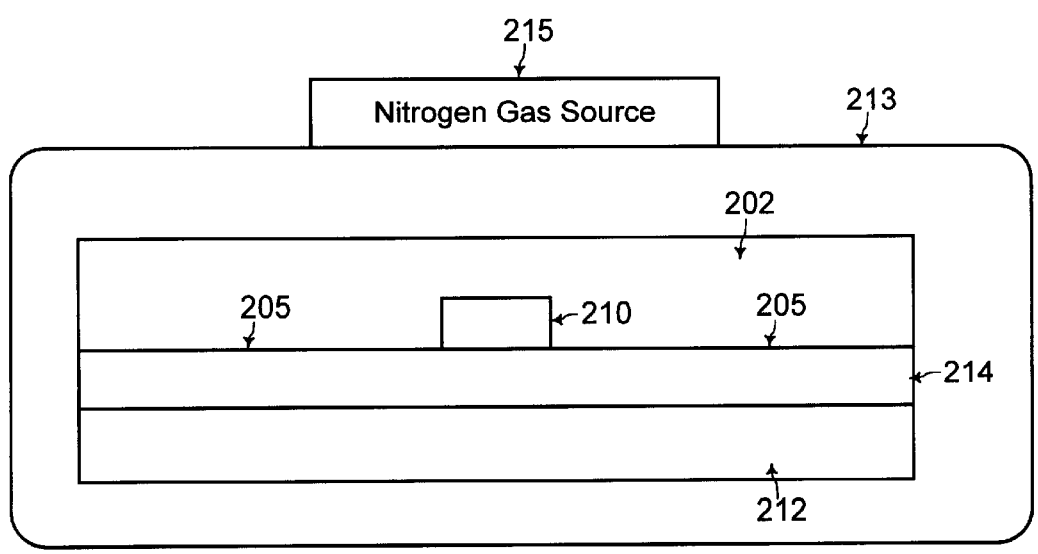

Referring to FIG. 9, the first face 205 of the first semiconductor substrate 202 is placed on the layer of dielectric material 214 of the second semiconductor substrate 212. Pressure is applied against the first semiconductor substrate 202 and the second semiconductor substrate 212 such that the dielectric island 210 and the first surface 205 of the first semiconductor substrate 202 are bonded to the layer of dielectric material 214. In one embodiment of the present invention, referring to FIG. 10, the first semiconductor substrate 202 is bonded to the layer of dielectric material 214 of the second semiconductor substrate 212 within a chamber 213 with nitrogen gas ($N_2$) from a nitrogen gas ($N_2$) source 215 flowing through the chamber 213 to prevent oxidation of any exposed surfaces of the first and second semiconductor substrates 202 and 212. Mechanisms for flowing nitrogen gas ($N_2$) through the chamber 213 are known to one of ordinary skill in the art of integrated circuit fabrication.

Figure 11:
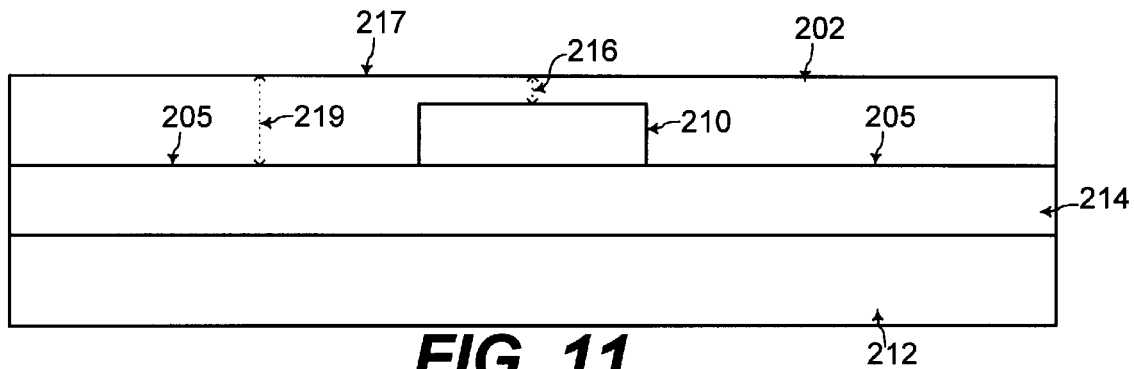

Referring to FIG. 11, in this manner, the dielectric island 210 and the first surface 205 of the first semiconductor substrate 202 are bonded to the layer of dielectric material 214 of the second semiconductor substrate 212. Further referring to FIG. 11, the second surface 217 of the first semiconductor substrate 202 is exposed. In addition, the second surface 217 of the first semiconductor substrate 202 is also polished down to adjust the thickness 216 of the semiconductor material of the first semiconductor substrate 202 remaining on top of the dielectric island 210. The thickness 216 of the semiconductor material of the first semiconductor substrate 202 remaining on top of the dielectric island 210 is in a range of from about 50 angstroms to about 200 angstroms according to one embodiment of the present invention. On the other hand, the thickness 219 of the semiconductor material of the first semiconductor substrate 202 disposed to the sides of the dielectric island 210 is in a range of from about 500 angstroms to about 1000 angstroms according to one embodiment of the present invention. Processes for polishing down the second surface 217 of the first semiconductor substrate 202 such as CMP (chemical mechanical polishing) processes are known to one of ordinary skill in the art of integrated circuit fabrication.

Figure 12:
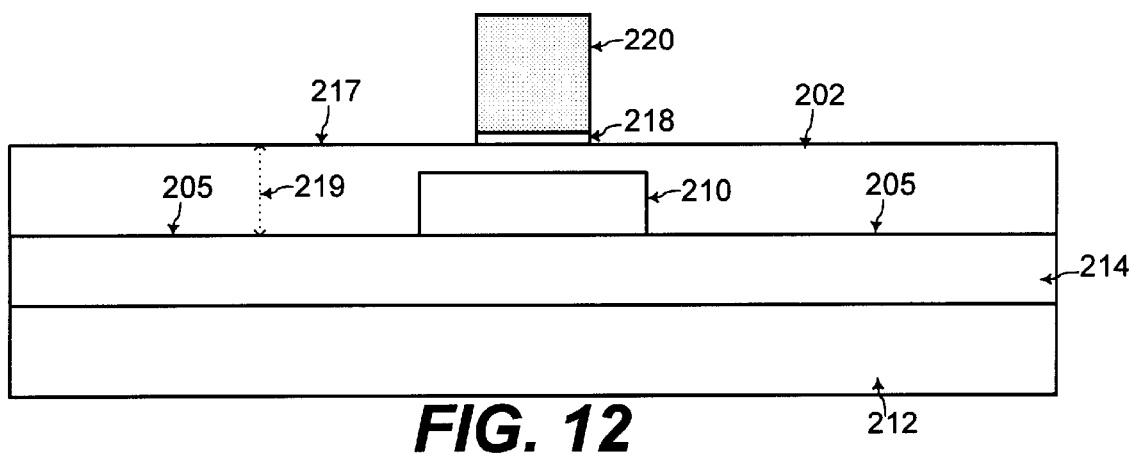

Referring to FIG. 12, a gate dielectric 218 and a gate electrode 220 are formed on a portion of the thinner semiconductor material of the first semiconductor substrate 202 remaining on the dielectric island 210. Portions of the thinner semiconductor material of the first semiconductor substrate 202 remaining on the dielectric island 210 remain exposed to the sides of the gate dielectric 218 and the gate electrode 220.

The gate dielectric 218 is comprised of silicon dioxide ($SiO_2$) according to one embodiment of the present invention. Alternatively, the gate dielectric 218 is comprised of a dielectric material such as metal oxide for example having a dielectric constant that is higher than that of silicon dioxide ($SiO_2$). When the gate dielectric 218 has a dielectric constant that is higher than the dielectric constant of silicon dioxide ($SiO_2$), the gate dielectric 218 has a higher thickness than if the gate dielectric 218 were comprised of silicon dioxide ($SiO_2$), to minimize undesired tunneling current through the gate dielectric 218. Processes for forming such a gate dielectric 218 are known to one of ordinary skill in the art of integrated circuit fabrication.

The gate electrode 220 is comprised of polysilicon according to one embodiment of the present invention. Processes for forming such a gate electrode 220 are known to one of ordinary skill in the art of integrated circuit fabrication. The present invention may be practiced with other types of materials for the gate dielectric 218 and the gate electrode 220, as would be apparent to one of ordinary skill in the art of integrated circuit fabrication from the description herein.

Figure 13:
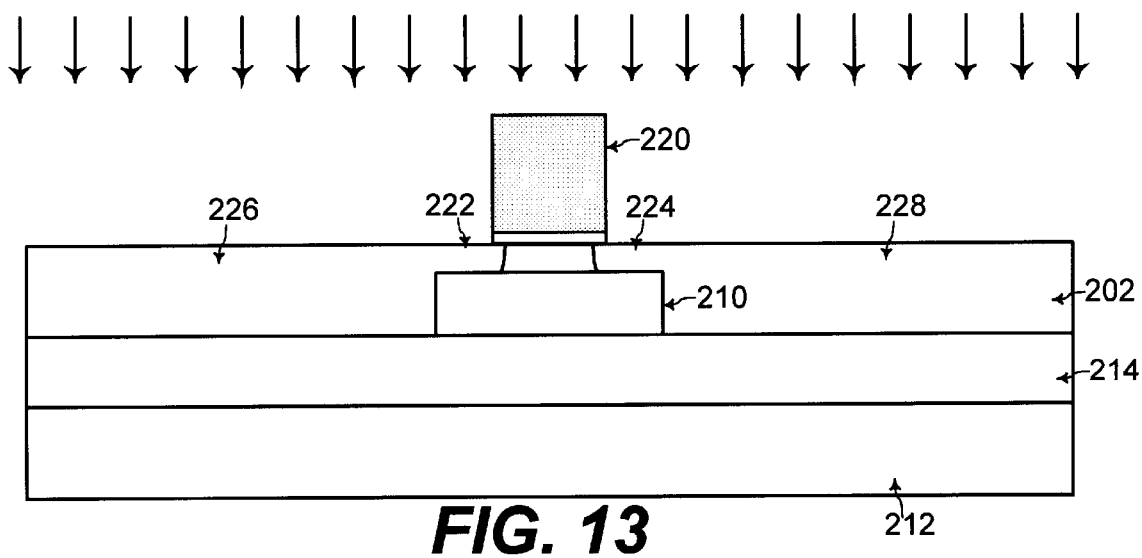

Referring to FIG. 13, a drain and source dopant is implanted into exposed regions of the first semiconductor substrate 202. The drain and source dopant is an N-type dopant such as phosphorous or arsenic for example for fabrication of an NMOSFET (N-channel Metal Oxide Semiconductor Field Effect Transistor). Alternatively, the drain and source dopant is a P-type dopant such as boron for example for fabrication of a PMOSFET (P-channel Metal Oxide Semiconductor Field Effect Transistor). The dose of such drain and source dopant is in a range of from about $1 \times 10^{15}$ /$cm^2$ to about $1 \times 10^{16}$ /$cm^2$. Processes for implantation of such drain and source dopant are known to one of ordinary skill in the art of integrated circuit fabrication.

Further referring to FIG. 13, a drain extension region 222 and a source extension region 224 are formed by the drain and source dopant being implanted in the thinner semiconductor material of the first semiconductor substrate 202 disposed on the dielectric island 210. In addition, a drain contact region 226 and a source contact region 228 are formed by the drain and source dopant being implanted in the thicker semiconductor material of the first semiconductor substrate 202 disposed to the sides of the dielectric island 210.

Figure 14:
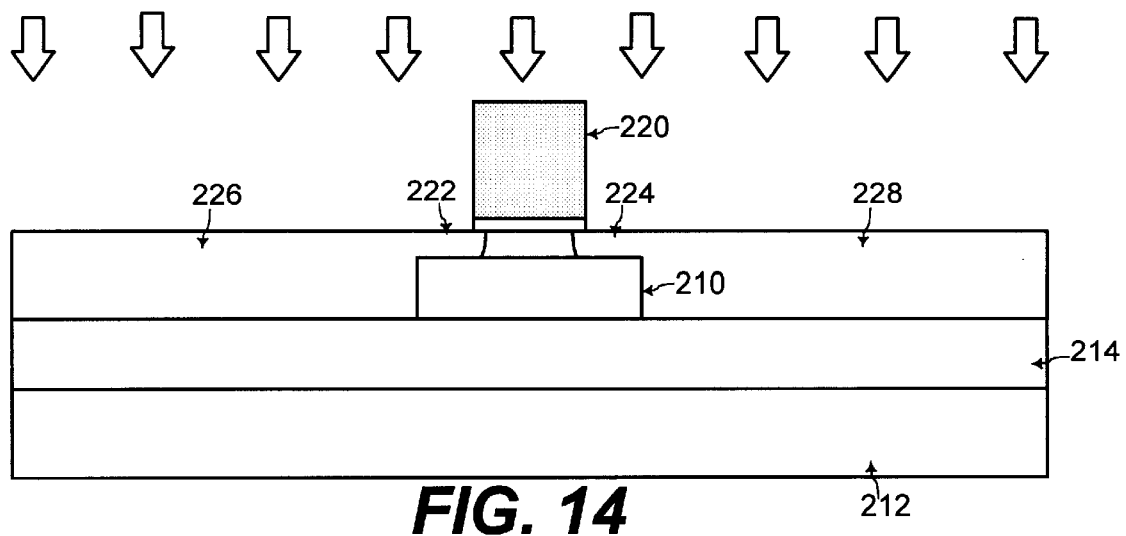

Referring to FIG. 14, the drain and source dopant within the drain and source extension regions 222 and 224 and within the drain and source contact regions 226 and 228 is activated in a laser thermal anneal process. In the laser thermal anneal process according to one embodiment of the present invention, laser beams are directed toward the drain and source extension regions 222 and 224 and toward the drain and source contact regions 226 and 228 with a laser fluence in a range of from about 0.5 Joules/$cm^2$ to about 0.8 Joules/$cm^2$ for a time period of from about 1 nanoseconds to about 10 nanoseconds. Laser thermal anneal processes for activating dopant within semiconductor material are known to one of ordinary skill in the art of integrated circuit fabrication.

Figure 15:
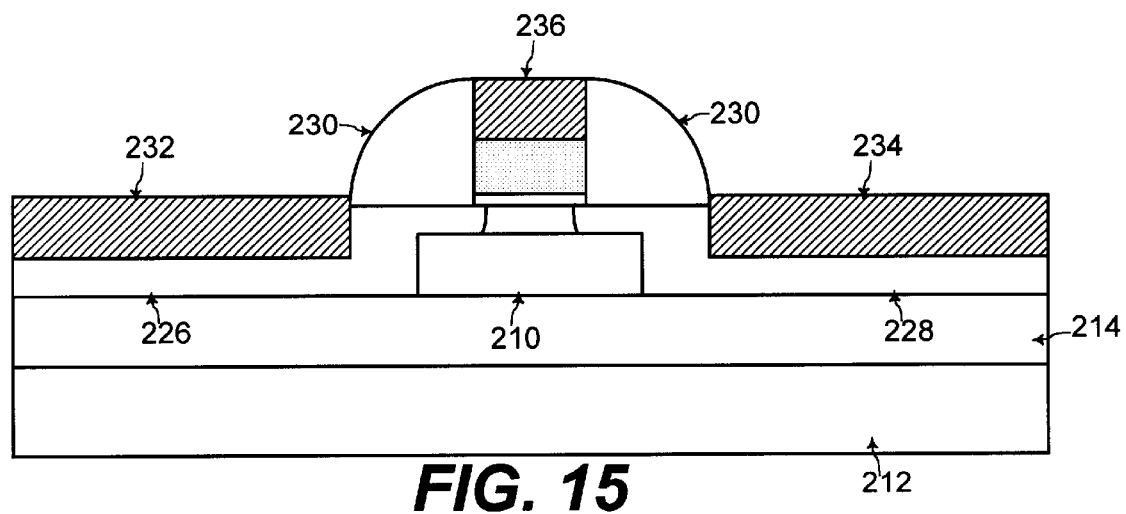

Referring to FIG. 15, spacers 230 are formed at the sidewalls of the gate dielectric 218 and the gate electrode 220 to be disposed over the drain and source extension regions 222 and 224. The spacers 230 are comprised of a dielectric material such as silicon dioxide ($SiO_2$) according to one embodiment of the present invention. Processes for forming such spacers 230 are known to one of ordinary skill in the art of integrated circuit fabrication.

Further referring to FIG. 15, a drain silicide 232 is formed with the drain contact region 226, and a source silicide 234 is formed with the source contact region 228. A gate silicide 236 is formed with the gate electrode 220. Silicidation processes for forming the drain silicide 232, the source silicide 234, and the gate silicide 236 are known to one of ordinary skill in the art of integrated circuit fabrication. The drain silicide 232, the source silicide 234, and the gate silicide 236 provide contact to the drain, the source, and the gate, respectively, of the MOSFET.

In this manner, the drain and source extension regions 222 and 224 are formed with the thinner semiconductor material on the dielectric island 210 to minimize short channel effects of the MOSFET. On the other hand, the drain and source contact regions 226 and 228 are formed with the thicker semiconductor material to the sides of the dielectric island 210 such that thicker drain and source silicides 232 and 234 are formed. With thicker drain and source suicides 232 and 234, series resistance at the drain and source of the MOSFET is minimized to enhance the speed performance of the MOSFET. In addition, the MOSFET is formed in SOI (semiconductor on insulator) technology such that junction capacitance is minimized for the MOSFET to enhance the speed performance of the MOSFET.

Furthermore, referring to FIG. 13, the drain and source extension regions 222 and 224 and the drain and source contact regions 226 and 228 are formed with one implantation step for implanting the drain and source dopant. In contrast, referring to the MOSFET 150 formed in SOI (semiconductor on insulator) technology according to the prior art, two separate implantation steps are used for forming the drain and source extension junctions 156 and 158 and then forming the drain and source contact regions 162 and 164. A separate implantation step is used for forming the drain and source extension junctions 156 and 158 having a shallow depth than the drain and source contact junctions 162 and 164, according to the prior art. The extra implantation step of the prior art may slow down the manufacture of integrated circuits. The dielectric island 210 limits the depth of drain and source extension regions 222 and 224 according to an aspect of the present invention such that just one implantation step is used for forming both the drain and source extension regions 222 and 224 and the drain and source contact regions 226 and 228 for more efficient manufacture of integrated circuits.

The foregoing is by way of example only and is not intended to be limiting. For example, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "side" and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor in SOI (semiconductor on insulator) technology, the method including the steps of:
   A. etching an opening through a first surface of a first semiconductor substrate;
   B. depositing a dielectric material to fill said opening;
   C. polishing said dielectric material and said first surface of said first semiconductor substrate to form a dielectric island comprised of said dielectric material surrounded by said first surface of said first semiconductor substrate that is exposed;
      wherein semiconductor material of said first semiconductor substrate remains on said dielectric island toward a second surface of said semiconductor substrate;
   D. forming a layer of dielectric material on a second semiconductor substrate;
   E. placing said first surface of said first semiconductor substrate on said layer of dielectric material of said second semiconductor substrate such that said dielectric island and said first surface of said first semiconductor substrate are bonded to said layer of dielectric material;
      wherein said second surface of said first semiconductor substrate is exposed;
   F. forming a gate dielectric and a gate electrode over a portion of said semiconductor material disposed on said dielectric island on said second surface of said first semiconductor substrate; and
   G. implanting a drain and source dopant into said second surface of said first semiconductor substrate that is exposed;
      wherein a drain extension region and a source extension region are formed by said drain and source dopant being implanted in said semiconductor material disposed on said dielectric island;
      and wherein a drain contact region and a source contact region are formed by said drain and source dopant being implanted in said semiconductor material of said first semiconductor substrate disposed to sides of said dielectric island.

2. The method of claim 1, further including the step of:
   performing a thermal anneal process to activate said drain and source dopant within said drain and source extension regions and within said drain and source contact regions.

3. The method of claim 2, wherein a laser thermal anneal process is performed with a laser fluence in a range of from about 0.5 Joules/$cm^2$ to about 0.8 Joules/$cm^2$ for a time period of from about 1 nanoseconds to about 10 nanoseconds to activate said drain and source dopant within said drain and source extension regions and within said drain and source contact regions.

4. The method of claim 1, further including the steps of:
   forming spacers on sidewalls of said gate electrode and said gate dielectric such that said spacers are disposed over said drain and source extension regions; and
   forming a drain silicide with said drain contact region and forming a source silicide with said source contact region.

5. The method of claim 1, wherein said first semiconductor substrate is comprised of silicon, and wherein said dielectric island is comprised of silicon dioxide ($SiO_2$).

6. The method of claim 5, wherein said second semiconductor substrate is comprised of silicon, and wherein said layer of dielectric material formed on said second semiconductor substrate is comprised of silicon dioxide ($SiO_2$).

7. The method of claim 1, wherein said semiconductor material of said first semiconductor substrate remaining on said dielectric island for forming said drain and source extension regions has a thickness in a range of from about 50 angstroms to about 200 angstroms.

8. The method of claim 7, wherein said semiconductor material of said first semiconductor substrate disposed to the sides of said dielectric island for forming said drain and source contact regions has a thickness in a range of from about 500 angstroms to about 1000 angstroms.

9. The method of claim 1, wherein said step E is performed within a chamber with nitrogen gas ($N_2$) flowing through said chamber.

10. The method of claim 1, wherein said dose of said drain and source dopant is in a range of from about $1\times10^{15}/cm^2$ to about $1\times10^{16}/cm^2$.

11. The method of claim 1, further including the step of: polishing down a portion of said semiconductor material on said dielectric island before said step F.

12. The method of claim 1, wherein said drain and source dopant is comprised of an N-type dopant for fabrication of an NMOSFET (N-channel Metal Oxide Semiconductor Field Effect Transistor).

13. The method of claim 1, wherein said drain and source dopant is comprised of a P-type dopant for fabrication of a PMOSFET (P-channel Metal Oxide Semiconductor Field Effect Transistor).

14. A method for fabricating a MOSFET (Metal Oxide Semiconductor Field Effect Transistor) in SOI (semiconductor on insulator) technology, the method including the steps of:

A. etching an opening through a first surface of a first semiconductor substrate;

B. depositing a dielectric material to fill said opening;

C. polishing said dielectric material and said first surface of said first semiconductor substrate to form a dielectric island comprised of said dielectric material surrounded by said first surface of said first semiconductor substrate that is exposed;

wherein semiconductor material of said first semiconductor substrate remains on said dielectric island toward a second surface of said semiconductor substrate;

wherein said first semiconductor substrate is comprised of silicon, and wherein said dielectric island is comprised of silicon dioxide ($SiO_2$);

D. forming a layer of dielectric material on a second semiconductor substrate;

wherein said second semiconductor substrate is comprised of silicon, and wherein said layer of dielectric material formed on said second semiconductor substrate is comprised of silicon dioxide ($SiO_2$);

E. placing said first surface of said first semiconductor substrate on said layer of dielectric material of said second semiconductor substrate such that said dielectric island and said first surface of said first semiconductor substrate are bonded to said layer of dielectric material;

wherein said step E is performed within a chamber with nitrogen gas ($N_2$) flowing through said chamber;

and wherein said second surface of said first semiconductor substrate is exposed;

F. polishing down a portion of said semiconductor material on said dielectric island;

G. forming a gate dielectric and a gate electrode over a portion of said semiconductor material disposed on said dielectric island on said second surface of said first semiconductor substrate;

H. implanting a drain and source dopant into said second surface of said first semiconductor substrate that is exposed;

wherein a drain extension region and a source extension region are formed by said drain and source dopant being implanted in said semiconductor material disposed on said dielectric island;

wherein said dose of said drain and source dopant is in a range of from about $1\times10^{15}/cm^2$ to about $1\times10^{16}/cm^2$;

wherein said semiconductor material of said first semiconductor substrate remaining on said dielectric island for forming said drain and source extension regions has a thickness in a range of from about 50 angstroms to about 200 angstroms;

wherein a drain contact region and a source contact region are formed by said drain and source dopant being implanted in said semiconductor material of said first semiconductor substrate disposed to sides of said dielectric island;

wherein said semiconductor material of said first semiconductor substrate disposed to the sides of said dielectric island for forming said drain and source contact regions has a thickness in a range of from about 500 angstroms to about 1000 angstroms;

and wherein said drain and source dopant is comprised of an N-type dopant for fabrication of an NMOSFET (N-channel Metal Oxide Semiconductor Field Effect Transistor), and wherein said drain and source dopant is comprised of a P-type dopant for fabrication of a PMOSFET (P-channel Metal Oxide Semiconductor Field Effect Transistor);

I. performing a laser thermal anneal process with a laser fluence in a range of from about 0.5 Joules/$cm^2$ to about 0.8 Joules/$cm^2$ for a time period of from about 1 nanoseconds to about 10 nanoseconds to activate said drain and source dopant within said drain and source extension regions and within said drain and source contact regions;

J. forming spacers on sidewalls of said gate electrode and said gate dielectric such that said spacers are disposed over said drain and source extension regions; and K. forming a drain silicide with said drain contact region and forming a source silicide with said source contact region.

* * * * *